(12) United States Patent
Khater et al.

(10) Patent No.: US 7,087,940 B2
(45) Date of Patent: Aug. 8, 2006

(54) STRUCTURE AND METHOD OF FORMING BIPOLAR TRANSISTOR HAVING A SELF-ALIGNED RAISED EXTRINSIC BASE USING SELF-ALIGNED ETCH STOP LAYER

(75) Inventors: Marwan H. Khater, Poughkeepsie, NY (US); Francois Pagette, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 10/709,220

(22) Filed: Apr. 22, 2004

(65) Prior Publication Data

US 2005/0236645 A1    Oct. 27, 2005

(51) Int. Cl.
*H01L 31/072* (2006.01)
*H01L 21/331* (2006.01)

(52) U.S. Cl. .................................. 257/197; 438/320
(58) Field of Classification Search ................ 257/197; 438/320
See application file for complete search history.

(56) References Cited

U.S. PATENT DOCUMENTS

| | | | |
|---|---|---|---|
| 5,128,271 A | 7/1992 | Bronner et al. | |
| 5,494,836 A | 2/1996 | Imai | |
| 5,506,427 A | 4/1996 | Imai | |
| 5,962,880 A | 10/1999 | Oda et al. | |
| 6,346,453 B1 | 2/2002 | Kovacic et al. | |
| 6,429,085 B1 | 8/2002 | Pinter | |
| 6,437,376 B1 | 8/2002 | Ozkan | |
| 6,472,262 B1 | 10/2002 | Chantre et al. | |
| 6,559,020 B1 | 5/2003 | Salmi | |
| 6,686,250 B1* | 2/2004 | Kalnitsky et al. | 438/345 |
| 6,864,560 B1* | 3/2005 | Khater et al. | 257/565 |
| 6,927,476 B1* | 8/2005 | Freeman et al. | 257/586 |
| 6,960,820 B1* | 11/2005 | Freeman et al. | 257/586 |
| 6,965,133 B1* | 11/2005 | Geiss et al. | 257/197 |
| 6,972,443 B1* | 12/2005 | Khater | 257/197 |
| 6,979,884 B1* | 12/2005 | Ahlgren et al. | 257/588 |
| 6,982,442 B1* | 1/2006 | Chan et al. | 257/198 |
| 7,002,221 B1* | 2/2006 | Khater et al. | 257/360 |
| 2005/0236647 A1* | 10/2005 | Khater | 257/197 |
| 2005/0242373 A1* | 11/2005 | Ahlgren et al. | 257/197 |

OTHER PUBLICATIONS

Jagannathan, et al., "Self-aligned SiGe NPN Transistors with 285 GHz fMAX and 207 GHz fT in a Manufacturable Technology," IEEE Electron Device Letters 23, 258 (2002).
J.S. Rieh, et al., "SiGe HBTs with Cut-off Frequency of 350 GHz," International Electron Device Meeting Technical Digest, 771 (2002).

* cited by examiner

*Primary Examiner*—Evan Pert
(74) *Attorney, Agent, or Firm*—Daryl K. Neff; H. Daniel Schnurmann

(57) ABSTRACT

A bipolar transistor structure and method of making the bipolar transistor are provided. The bipolar transistor includes a collector region, an intrinsic base layer overlying the collector region, and an emitter overlying the intrinsic base layer. An opened etch stop layer includes a layer of dielectric material overlying the intrinsic base, the opened etch stop layer self-aligned to the emitter. The bipolar transistor further includes a raised extrinsic base self-aligned to the emitter, the raised extrinsic base overlying the intrinsic base layer.

20 Claims, 12 Drawing Sheets

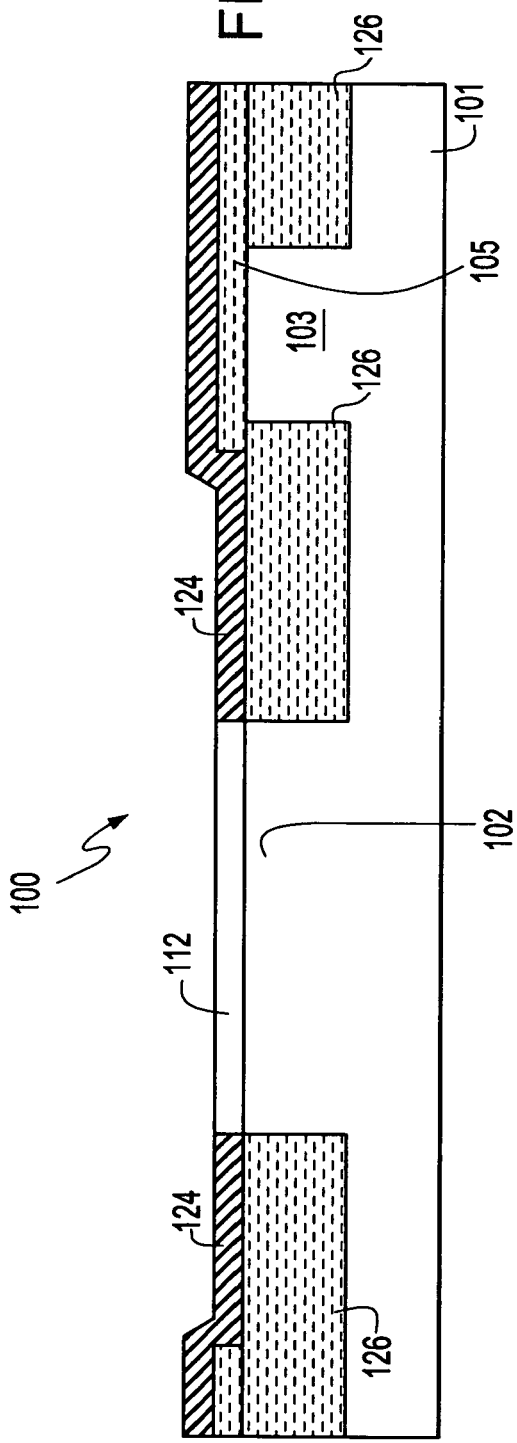

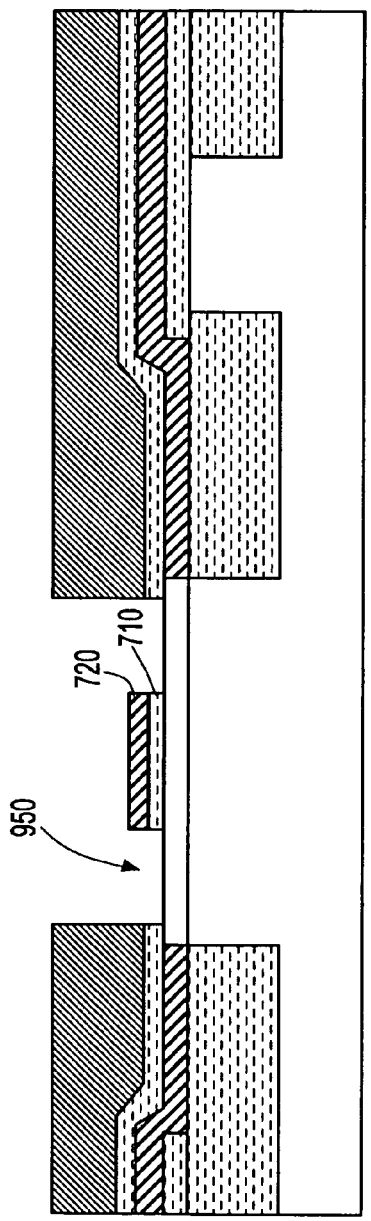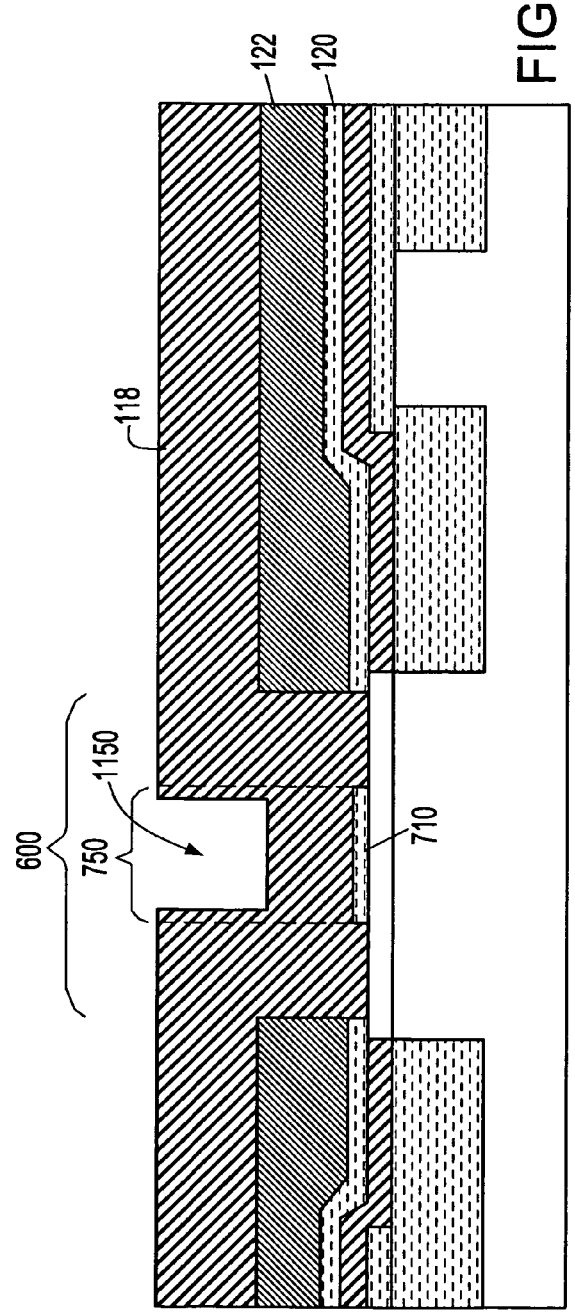

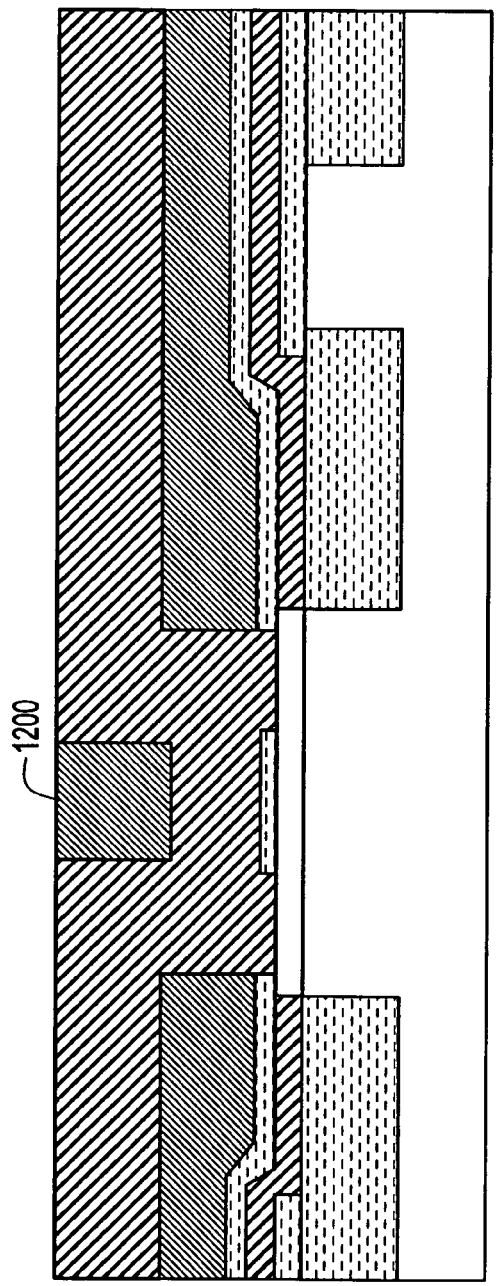
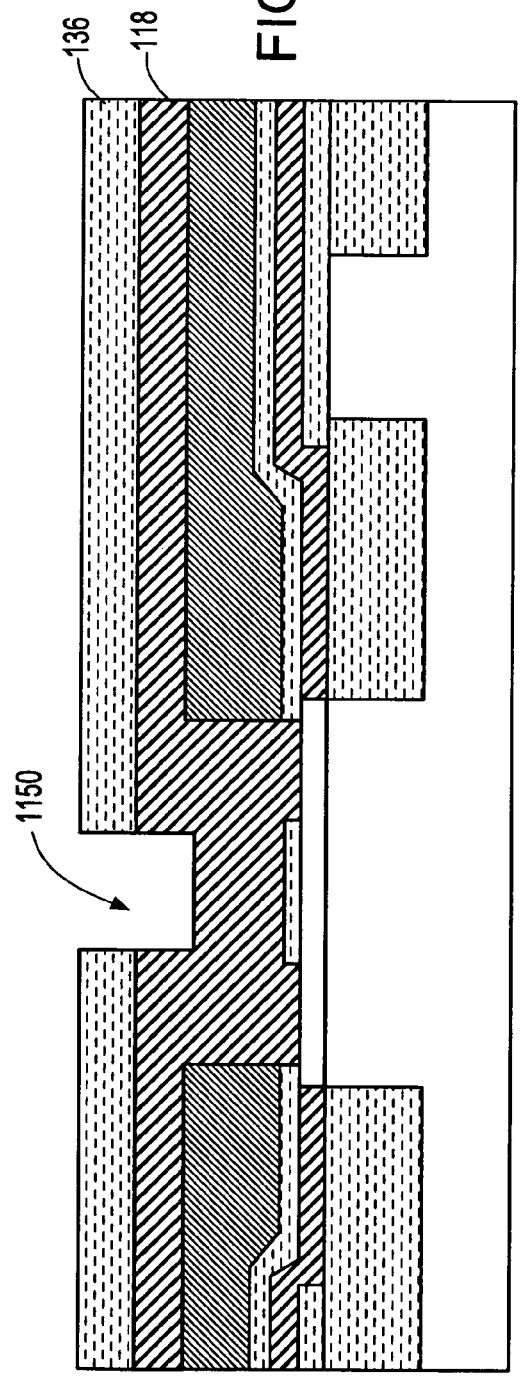

STRUCTURE AND METHOD OF FORMING BIPOLAR TRANSISTOR HAVING A SELF-ALIGNED RAISED EXTRINSIC BASE USING SELF-ALIGNED ETCH STOP LAYER

BACKGROUND OF INVENTION

High performance circuits, especially those used for radio frequency chips, favor the use of heterojunction bipolar transistors (HBTs) to provide high maximum oscillation frequency $f_{MAX}$ and high transit frequency $f_T$, also referred to as "cutoff frequency". HBTs have a structure in which the base of the transistor includes a relatively thin layer of single-crystal semiconductor alloy material. As an example, an HBT fabricated on a substrate of single-crystal silicon can have a single-crystal base formed of silicon germanium (SiGe) having substantial germanium content and profile to improve high-speed performance. Such HBT is commonly referred to as a SiGe HBT.

The juxtaposition of alloy semiconductor materials within a single semiconductor crystal is called a "heterojunction." The heterojunction results in an increase in current gain. This increase in gain allows a significant increase in base doping, and corresponding decrease in base resistance, which would otherwise result in a decrease in current gain. Further, by varying the composition of the semiconductor alloy in the base as a function of position, a significant quasi-static field may be created that enhances the velocity of charge carriers in the base. Increased velocity, in turn, enables higher gain and cutoff frequency to be achieved than in transistors having a uniform semiconductor alloy composition throughout.

To increase the performance of an HBT, it is desirable to increase both the transit frequency $f_T$ and the maximum oscillation frequency $f_{MAX}$. $f_{MAX}$ is a function of $f_T$ and of parasitic resistances and parasitic capacitances (collectively referred to herein as "parasitics") between elements of the transistor according to the formula $f_{MAX} = (f_T / 8\pi * C_{cb} * R_b)^{1/2}$. The most significant parasitics are the collector-base capacitance $C_{cb}$ and the base resistance $R_b$ because their values are typically larger than the other parasitics, making their effects on $f_{MAX}$ more pronounced. Thus, it is desirable to provide an HBT structure and method by which $C_{cb}$ and $R_b$ are significantly reduced.

As provided by the prior art, differences exist among SiGe HBTs, which allow them to achieve higher performance, or to be more easily fabricated. A cross-sectional view of one such prior art SiGe HBT 10 is illustrated in FIG. 1. Such non self-aligned HBT 10 can be fabricated relatively easily, but other designs provide better performance. As depicted in FIG. 1, the HBT 10 includes an intrinsic base layer 12, which is disposed in vertical relation between the emitter 14 and the collector 16. The intrinsic base layer 12 includes a single-crystal layer of silicon-germanium (SiGe). The intrinsic base layer 12 forms a heterojunction with the collector 16. While the bipolar transistor illustrated in FIG. 1 is described as an HBT having an intrinsic base layer including a layer of SiGe, the intrinsic base layer can be single-crystal silicon, in which case the transistor is not a "heterojunction" bipolar transistor, but simply a bipolar transistor.

A raised extrinsic base 18 is disposed over the intrinsic base layer 12 as an annular structure surrounding the emitter 14. The purpose of the raised extrinsic base 18 is to inject a base current into the intrinsic base layer 12. For high performance, the interface 24 between the raised extrinsic base 18 and the intrinsic base layer is close to the junction between the emitter 14 and the intrinsic base layer 12. By making this distance small, the resistance across the intrinsic base layer 12 between the interface 24 and the emitter 14 is decreased, thereby reducing the base resistance $R_b$ (hence RC delay) of the HBT 10. It is desirable that the interface 24 to the raised extrinsic base be self-aligned to the edge of the emitter 14. Such self-alignment would exist if the raised extrinsic base were spaced from the emitter 14 only by the width of one or more dielectric spacers formed on a sidewall of the raised extrinsic base 18.

However, in the HBT 10 shown in FIG. 1, the interface 24 is not self-aligned to the emitter 14, and the distance separating them is not as small or as symmetric as desirable. A dielectric etch stop layer, portions 21, 22 of which are visible in the view of FIG. 1, is disposed as an annular structure surrounding the emitter 14. Portions 21, 22 of the etch stop layer separate the raised extrinsic base 18 from the intrinsic base layer 12 on different sides of the emitter 14, making the two structures not self-aligned. Moreover, as shown in FIG. 1, because of imperfect alignment between lithography steps used to define the edges of portions 21 and 22 and those used to define the emitter opening, the lengths of portions 21 and 22 can become non-symmetric about the emitter opening, causing performance to vary.

The etch stop layer functions as a sacrificial etch stop layer during fabrication. The formation of the etch stop layer and its use are as follows. After forming the intrinsic base layer 12 by epitaxial growth onto the underlying substrate 11, a layer of silicon dioxide is deposited as the etch stop layer and is then photolithographically patterned to expose the intrinsic base layer 12. This photolithographic patterning defines the locations of interface 24 at the edges of etch stop layer portions 21, 22, which will be disposed thereafter to the left and the right of the emitter 14. A layer of polysilicon is then deposited to a desired thickness, from which layer the extrinsic base 18 will be formed.

Thereafter, an opening is formed in the polysilicon by anisotropically etching the polysilicon layer (as by a reactive ion etch) selectively to silicon dioxide, such etch stopping on the etch stop layer. After forming a spacer in the opening, the etch stop layer is then wet etched within the opening to expose intrinsic base layer 12. A problem of the non-self-aligned structure of HBT 10 is high base resistance $R_b$. Resistance is a function of the distance of a conductive path, divided by the cross-sectional area of the path. As the intrinsic base layer 12 is a relatively thin layer, significant resistance can be encountered by current traversing the distance from the extrinsic base under etch stop layer portions 21, 22 to the area of the intrinsic base layer 12 under the emitter 14, such resistance limits the high speed performance of the transistor.

FIG. 2 is a cross-sectional view illustrating another HBT 50 according to the prior art. Like HBT 10, HBT 50 includes an intrinsic base 52 having a layer of silicon or silicon germanium and an extrinsic base 58 consisting of polysilicon in contact with the single-crystal intrinsic base 52. However, unlike HBT 10, HBT 50 does not include etch stop layer portions 21, 22, but rather, the raised extrinsic base 58 is self-aligned to the emitter 54, the extrinsic base 58 being spaced from the emitter 54 by a dielectric spacer. Self-aligned HBT structures such as HBT 50 have demonstrated high $f_T$ and $f_{MAX}$ as reported in Jagannathan, et al., "Self-aligned SiGe NPN Transistors with 285 GHz $f_{MAX}$ and 207 GHz $f_T$ in a Manufacturable Technology," IEEE Electron Device letters 23, 258 (2002) and J. S. Rieh, et al., "SiGe HBTs with Cut-off Frequency of 350 GHz," International Electron Device Meeting Technical Digest, 771 (2002). In such self-aligned HBT structures, the emitter 54 is self-aligned to the raised extrinsic base 58.

Several methods are provided by art that is background to the present invention for fabricating HBTs 50 like that shown in FIG. 2. According to one approach, chemical mechanical polishing (CMP) is used to planarize the extrinsic base polysilicon over a pre-defined sacrificial emitter pedestal, as described in U.S. Pat. Nos. 5,128,271 and 6,346,453. A drawback of this method is that the thickness of the extrinsic base, hence the base resistance $R_b$, can vary significantly between small and large devices, as well as, between low and high density areas of devices due to dishing of the polysilicon during CMP.

In another approach, described in U.S. Pat. Nos. 5,494,836; 5,506,427; and 5,962,880, the intrinsic base is grown using selective epitaxy inside an emitter opening and under an overhanging polysilicon layer of the extrinsic base. In this approach, self-alignment of the emitter to the extrinsic base is achieved by the epitaxially grown material under the overhang. However, with this approach, special crystal growth techniques are required to ensure good, low-resistance contact between the intrinsic base and the extrinsic base.

In another approach, described in U.S. Pat. Nos. 6,429,085; 6,437,376; 6,472,262; and 6,559,020, epitaxial growth is used to link the extrinsic base to an intrinsic base that is grown non-selectively. A major drawback of this method is that the link-up between the extrinsic base and the intrinsic base is done inside the emitter opening. As a result, processing which provides good control over the formation of the link-up layer can nevertheless adversely affect the final emitter dimension and the integrity of the emitter-base interface, i.e. junction. Alternatively, processing which provides good control over the final emitter dimension and emitter-base junction may fail to produce a link-up layer having sufficient quality. Stated another way, the self-alignment of the extrinsic base to the emitter and the final emitter dimension are closely coupled in this approach, and their processing quality is traded off in relation to the quality of the link-up process.

It would be desirable to provide a self-aligned bipolar transistor such as an HBT and method for making such bipolar transistor that is more easily performed and kept within tolerances, and which, therefore, overcomes the challenges to the performance of the prior art bipolar transistor and prior art fabrication methods.

It would further be desirable to increase the maximum oscillation frequency $f_{MAX}$ through change in the horizontal profiles of the collector, base, emitter and/or the junctions between them.

SUMMARY OF INVENTION

According to an aspect of the invention, a bipolar transistor is provided. The bipolar transistor includes a collector region, an intrinsic base layer overlying the collector region, and an emitter overlying the intrinsic base layer. An opened etch stop layer includes a layer of dielectric material overlying the intrinsic base, the opened etch stop layer self-aligned to the emitter. The bipolar transistor further includes a raised extrinsic base self-aligned to the emitter, the raised extrinsic base overlying the intrinsic base layer.

According to another aspect of the invention, a method of making a bipolar transistor is provided which includes: forming a collector region, forming an intrinsic base layer overlying the collector region, and forming a first layer of material overlying the intrinsic base layer. A first opening is then defined in the first layer. An etch stop layer overlying the intrinsic base layer is defined within the first opening, the etch stop layer having edges self-aligned to the first opening. A raised extrinsic base material is then conformally deposited over the first material and inside the first opening to define a second opening wholly overlying the etch stop layer. Thereafter, the second opening is downwardly extended to the etch stop layer. The etch stop layer is opened, and an emitter is formed within the second opening. A raised extrinsic base is formed from the deposited raised extrinsic base material, the raised extrinsic base self-aligned to the emitter.

BRIEF DESCRIPTION OF DRAWINGS

FIGS. 3 through 17 illustrate a bipolar transistor and its fabrication according to a first preferred embodiment of the invention.

DETAILED DESCRIPTION

The various embodiments provided in conjunction with the teachings of the present invention below include self-aligned transistor structures having raised extrinsic bases. In an embodiment of the invention, a self-aligned transistor is formed through use of a single photolithographic step which results in a self-aligned etch stop layer. The etch stop layer, along with an extrinsic base and an emitter are self-aligned to one another.

In various embodiments of the invention, the thickness of one or more conformal films deposited within an opening ultimately determines the emitter size. This feature allows for the formation of an emitter of sub-lithographic dimensions. Having a self-aligned transistor structure combined with a sub-lithographic emitter dimension allows for reduction in the lateral dimension of the transistor, helping to reduce resistances and thereby increase the speed of the transistor.

Figure 1:
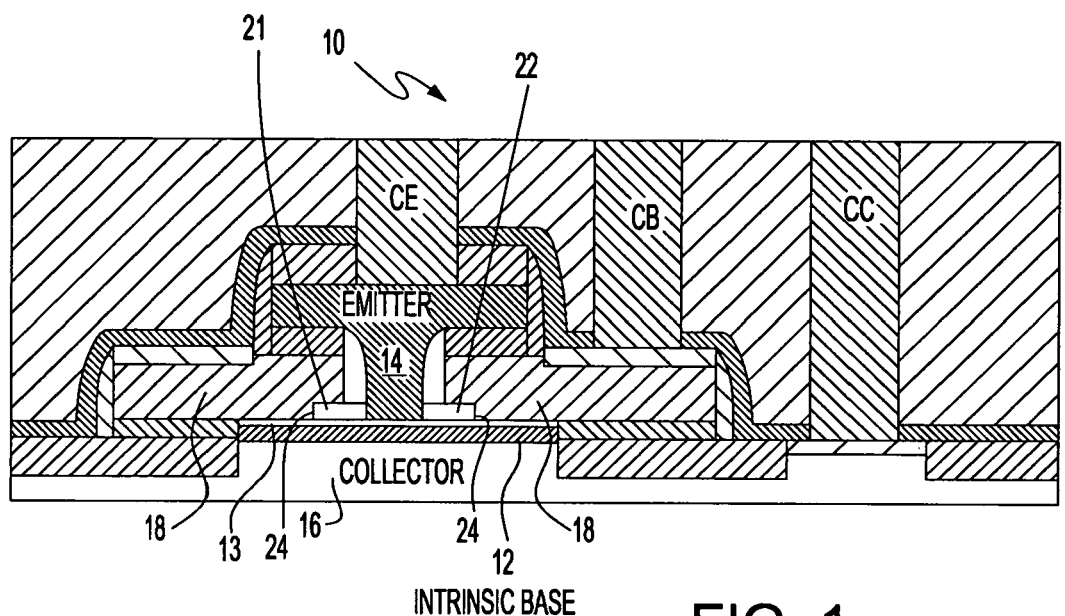
FIG. 1 illustrates a non-self-aligned bipolar transistor according to the prior art, in which the raised extrinsic base includes polysilicon and is not self-aligned to the emitter.
Figure 2:
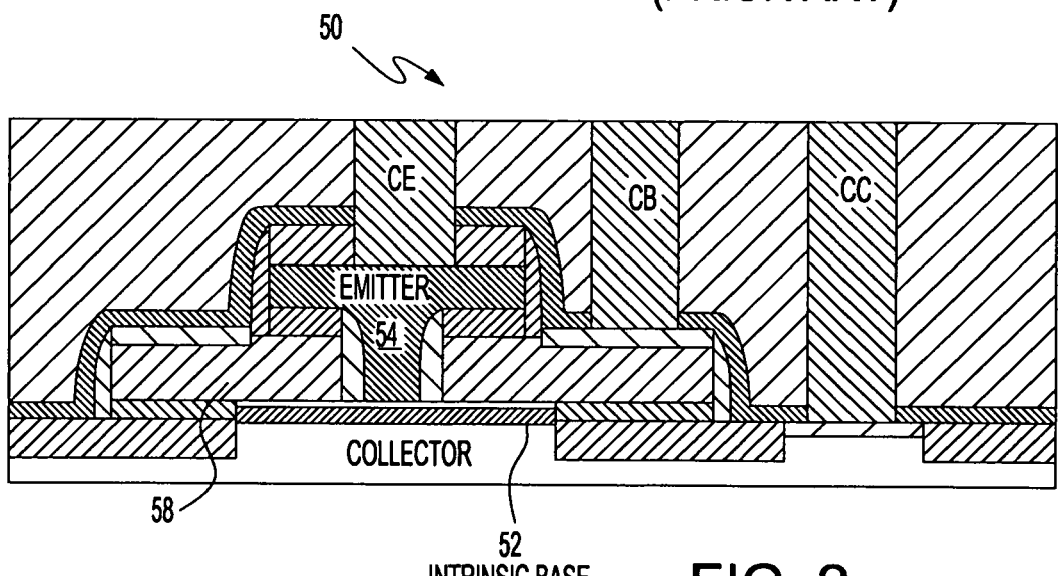
FIG. 2 illustrates a self-aligned bipolar transistor according to the prior art, in which the raised extrinsic base includes polysilicon and is self-aligned to the emitter.
Figure 3:
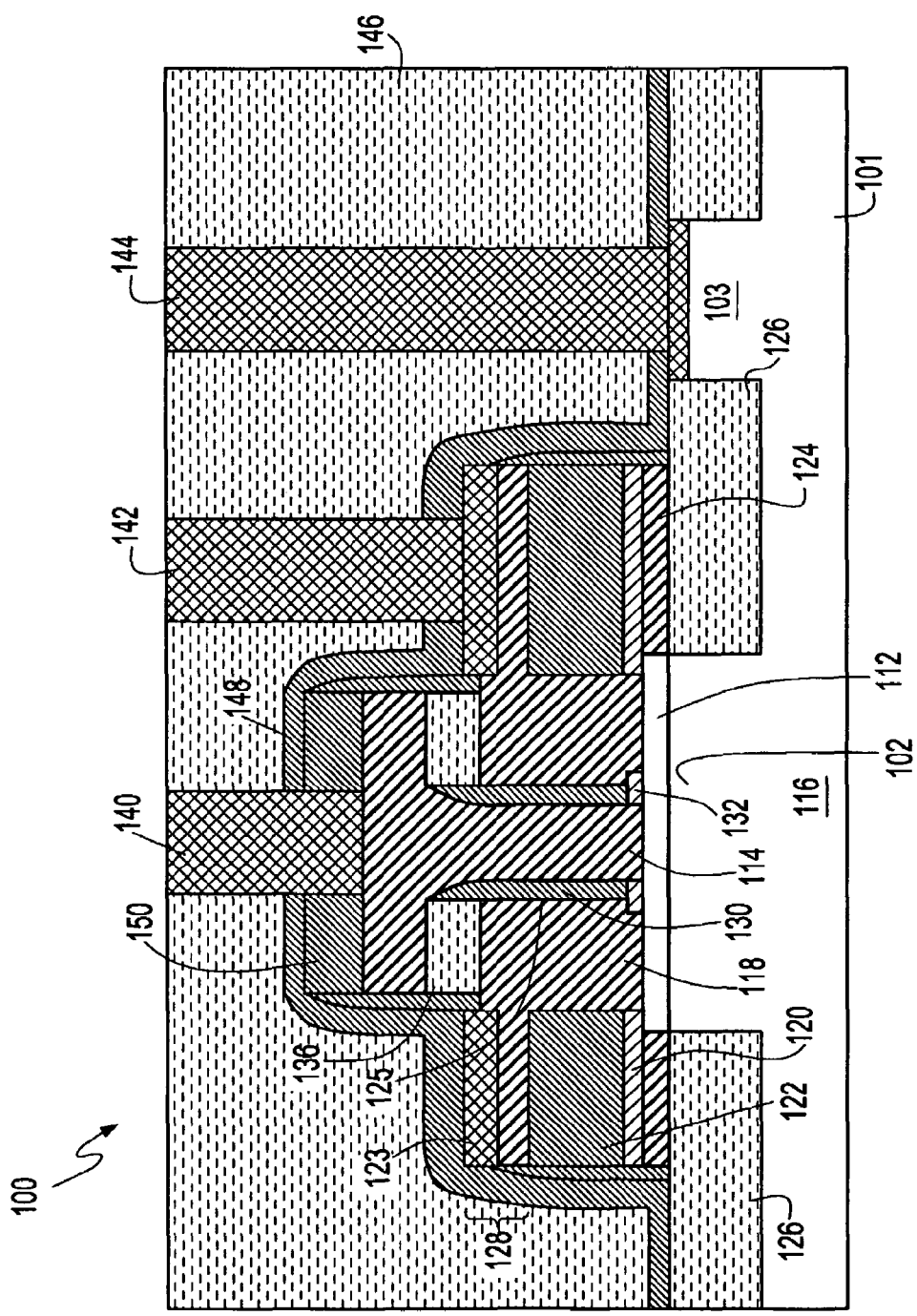

FIG. 3 is a cross-sectional view illustrating the structure of an HBT 100 according to a first embodiment of the invention. As shown in FIG. 3, HBT 100 is desirably fabricated from a substrate 101, e.g. wafer, of single-crystal silicon. The HBT 100 includes an intrinsic base layer 112 including a single-crystal layer of silicon germanium (SiGe) disposed over a collector 116 of the silicon substrate 101, the intrinsic base layer 112 being disposed in an active area 102 of the substrate between shallow trench isolations 126. The collector 116 includes a collector region underlying the intrinsic base layer 112 in an active area 102, a collector reach-through region disposed in an active area 103, and a portion of the substrate underlying shallow trench isolation 126. An emitter 114 contacts the intrinsic base layer 112 of from above. The raised extrinsic base 128 of the HBT 100 includes a layer 118 of polysilicon disposed over the intrinsic base layer 112, and a layer of silicide 123 and/or metal disposed over the layer of polysilicon 118. A portion of the polysilicon layer 118 overlies insulating layers 122 and 120 of silicon nitride and silicon dioxide, respectively. Thus, the raised extrinsic base 128 of HBT 100 is formed as a stack of layers including layers 118 and 123 formed over the intrinsic base layer 112. A layer 124 of polysilicon is also at least partially disposed over a shallow trench isolation region 126 to the side of the intrinsic base layer 112. The oxide layer 120 and the nitride layer 122 are disposed over the polysilicon layer 124, which is at least partially, disposed over the shallow trench isolations 126.

The raised extrinsic base 128 is self-aligned to the emitter 114 and spaced therefrom by the width of an opened etch stop layer 132 where the emitter contacts the intrinsic base layer 112. The opened etch stop layer, desirably consists essentially of an oxide such as silicon dioxide. The opened etch stop layer extends only laterally between the raised extrinsic base 128 and the emitter 114, and does not extend vertically to wholly contact the sidewall 125 of the raised extrinsic base. A spacer 130 is disposed on a sidewall 125 of the polysilicon layer 118 of the raised extrinsic base 128 extending vertically from the opened etch stop layer 132. The spacer 130 preferably consists essentially of a nitride such as silicon nitride.

The raised extrinsic base 128 has an annular shape, surrounding the emitter 114. The emitter extends downwardly to contact the intrinsic base layer 112 through the opened etch stop layer 132 such that the raised extrinsic base 128 is self-aligned to the emitter 114. A layer of oxide 136 separates an upper portion of emitter 114 from the raised extrinsic base 128. Vertical contact to each of the raised extrinsic base 128, emitter 114 and collector 116 from a overlying wiring level (not shown) are provided through metal or metal-silicide filled vias 140, 142, and 144 that are etched into an overlying deposited interlevel dielectric layer (ILD) 146 and one or more additional dielectric layers 148 and 150 that cover the emitter, raised extrinsic base and collector. Desirably, dielectric layers 148 and 150 consist essentially of a nitride such as silicon nitride, and ILD 146 consists essentially of a deposited oxide, for example, deposited silicon dioxide from a TEOS precursor and/or borophosphosilicate glass (BPSG).

A method of fabricating the HBT according to an embodiment of the invention is illustrated in FIGS. 4 through 18. As depicted in FIG. 4, a single-crystal silicon substrate 101 is patterned to form a first active area 102 and a second active area 103, and shallow trench isolations 126 between the active areas 102 and 103. Desirably, the shallow trench isolations 126 are filled with a dense oxide, such as may be provided by a high electron density plasma (HDP) deposition. A layer 105 of dielectric material, preferably formed by depositing silicon dioxide, such as from a TEOS precursor, is patterned to expose first active area 102 but not second active area 103.

As also depicted in FIG. 4, an intrinsic base layer 112 including a layer of a single-crystal semiconductor is epitaxially grown on a surface of first active area 102. When the transistor is to be an HBT, the single-crystal semiconductor includes doped single-crystal SiGe. Otherwise, doped single-crystal silicon can be grown as the intrinsic base layer. SiGe layer 112 desirably has a germanium content which is greater than 20%, while the silicon content makes up a complementary percentage. Away from active area 102, a layer 124 of polycrystalline silicon or SiGe material is correspondingly deposited over STI regions 126 and dielectric layer 105 during the epitaxial growth.

Figure 6:
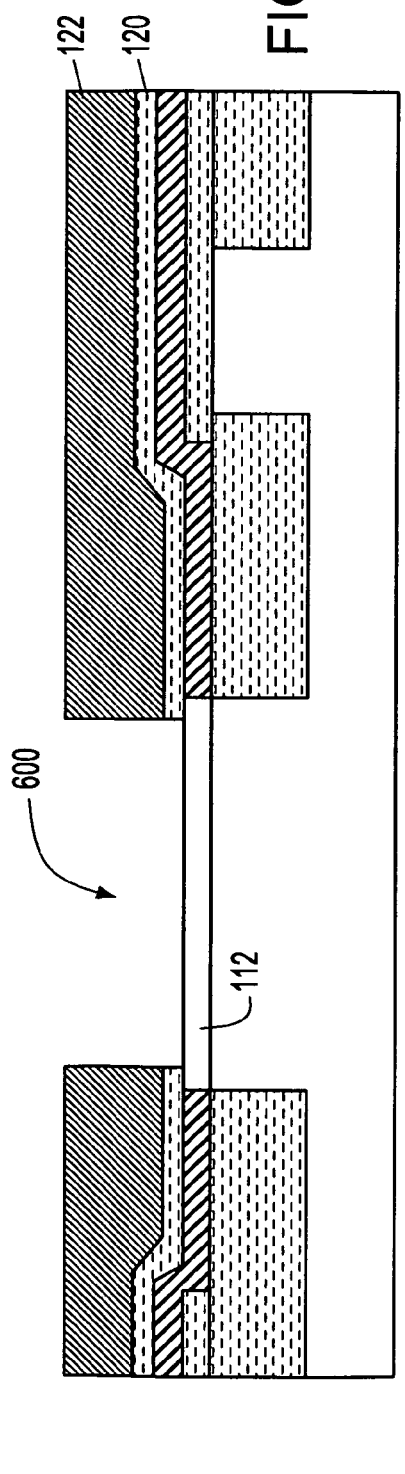

Thereafter, as shown in FIG. 5, a layered stack is provided. The stack includes a first relatively thin oxide layer 120 followed by subsequent deposition of a relatively thick layer of nitride 122. Next, as illustrated in FIG. 6, an opening 600 is made in the oxide-nitride stack. In one preferred embodiment, this process is performed as follows.

First a photoresist (not shown) is deposited over the nitride layer 122 and then lithographically patterned to expose the nitride layer 122 within an area overlying opening 600. The nitride layer 122 is patterned from the exposed opening in the photoresist, as by a reactive ion etch (RIE). Thereafter, the oxide layer 120 within the opening is stripped, as by a wet etch process selective to the semiconductor material of the intrinsic base layer 112. Such RIE is first performed to vertically etch the nitride layer 120, selective to oxide. The photoresist is stripped, and subsequent clean-up procedures can then be performed, if desired.

Figure 7:
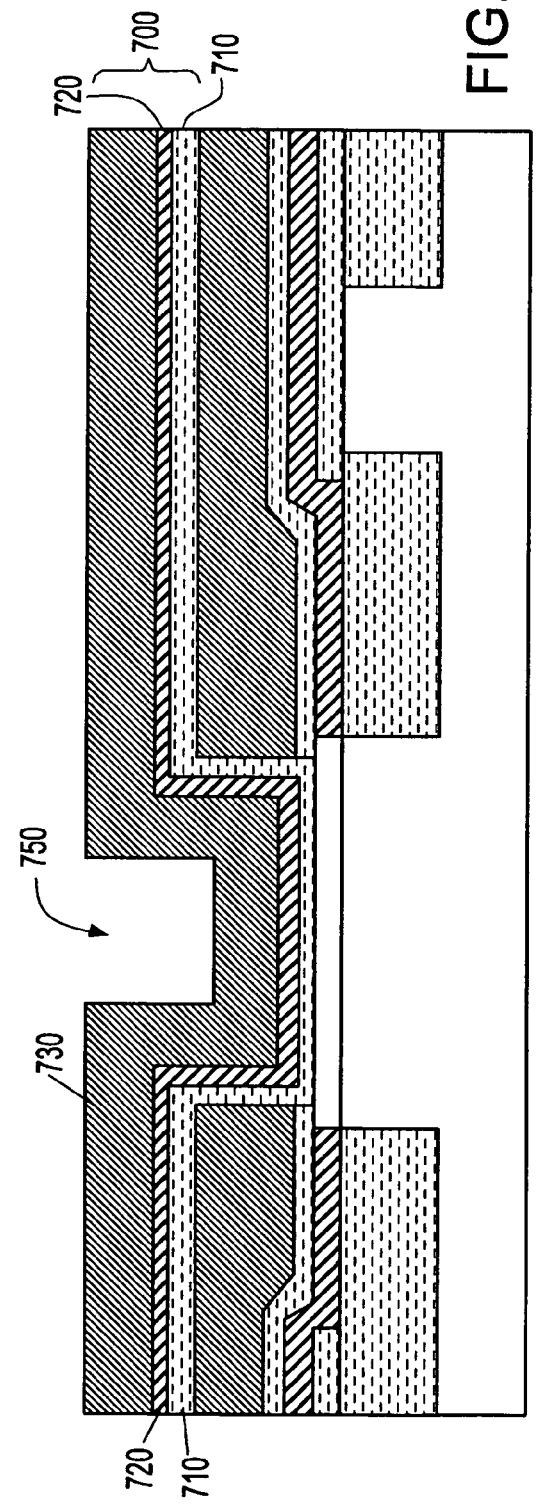

As shown in FIG. 7, a conformal stack 700 is deposited inside the opening 600 to cover the intrinsic base layer 112. The stack 700 preferably includes a layer of oxide 710, over which a layer of polysilicon 720 and a layer of nitride 730 are disposed, in that order. Desirably, the layer of polysilicon 720 is doped.

It is important for the stack 700 to be conformal so as to form a second opening 750 inside that follows the general pattern of the first opening 600 (FIG. 6). The second opening 750 is self-aligned to the first opening and its width ultimately determines the dimension of the opened self-aligned etch stop layer 132 of the transistor (FIG. 3).

Figure 8:
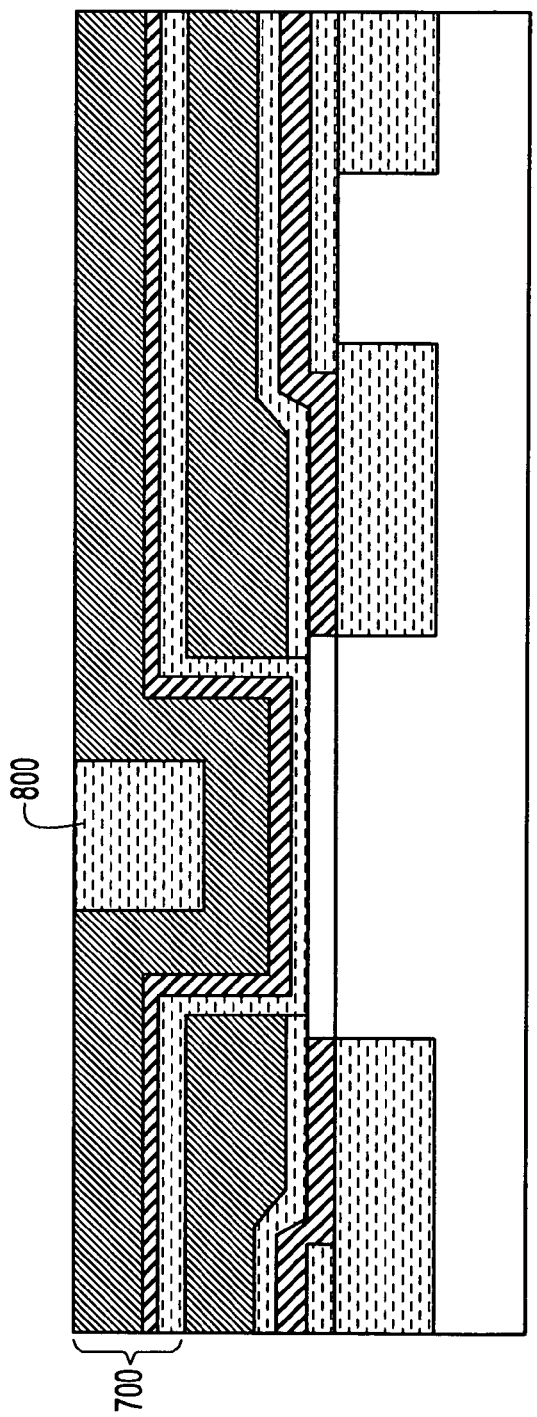

In FIG. 8, an oxide fill 800 is deposited over the stack 700 so as to completely fill the opening 750. This can be accomplished as, for example, by depositing the oxide to a given depth over the stack and then planarizing to the top of the nitride layer 730, such as by RIE selective to nitride. Alternatively, to planarize the deposited oxide to the top of the nitride layer 730, chemical mechanical polishing (CMP) can be performed selective to nitride.

Figure 9:
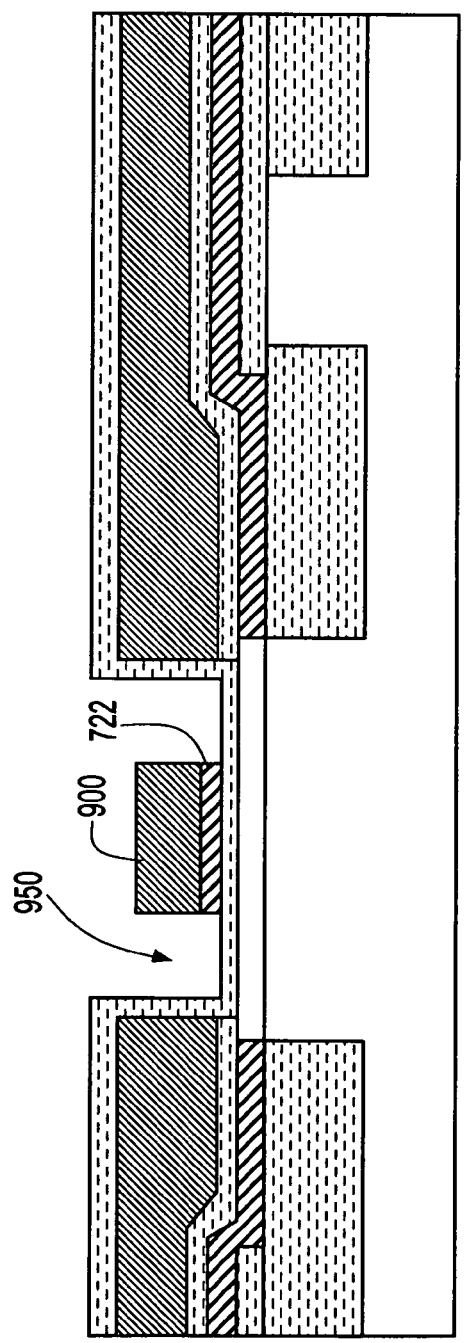

As shown in FIG. 9, the oxide fill is used as a hard mask to pattern the nitride layer and the polysilicon layer of the stack. In such process, the nitride layer is patterned by RIE to leave a remaining pattern 900. The oxide fill is then removed using an etching technique selective to nitride and polysilicon. Using the remaining pattern 900 of the nitride as a hard mask, exposed portions of the polysilicon layer are also selectively removed to form an opening 950, as shown in FIG. 9. Opening 950 has an annular shape which surrounds the nitride-pattern 900 and polysilicon pattern 722 remaining from the prior etch process.

Next, as illustrated in FIG. 10, the nitride pattern is removed from the area inside the annular opening 950 selective to oxide. Once the nitride layer is removed, the oxide layer 710 is also removed from all areas except as underlies the remaining polysilicon layer 720 selective to nitride and silicon. A self-aligned etch stop layer for subsequent raised extrinsic base and emitter processing is now provided by the oxide layer 710.

Thereafter, as shown in FIG. 11, a thick layer of polysilicon 118 is deposited over the structure, which will become a polysilicon layer of the raised extrinsic base. Desirably, the layer of polysilicon 118 is heavily doped. It is important for the polysilicon layer 118 to have good conformal characteristics to form a third opening 1150. The third opening forms as a result of the difference in height between the top of the nitride layer 122 and the oxide layer 710. The third opening is self-aligned to the first opening 600, which is formed as shown and described above with reference to FIG. 6. The third opening is also self-aligned to the etch stop layer 710. Processing must be controlled so as to result in the width of the third opening 1150 being equivalent to or smaller than the width of the second opening 750, because the oxide layer 710 will subsequently provide a etch stop layer having about the same width as the second opening 750. The width of the third opening 1150 ultimately defines an emitter opening having a dimension of lithographic, or more preferably, of sub-lithographic scale, the emitter opening being self-aligned to the etch stop layer 710.

Thereafter, as shown in FIG. 12, the third opening 1150 is filled with a nitride fill 1200. The nitride fill 1200 is preferably formed by depositing a layer of silicon nitride to overlie the entire polysilicon layer 118, and fill the opening 1200. The nitride layer is then planarized to the level of the third opening, such as by RIE selective to polysilicon, or alternatively by CMP, leaving the nitride fill 1200.

Thereafter, as shown in FIG. 13, a layer of oxide 136 is thermally grown from the top surface of the polysilicon layer 118. During this step, the nitride fill 1200 acts as a protective layer to shield the polysilicon layer underlying it from the oxidation process. Thereafter, the nitride fill 1200 is removed using from opening 1150 by any one of a variety of methods such as RIE.

Figure 14:
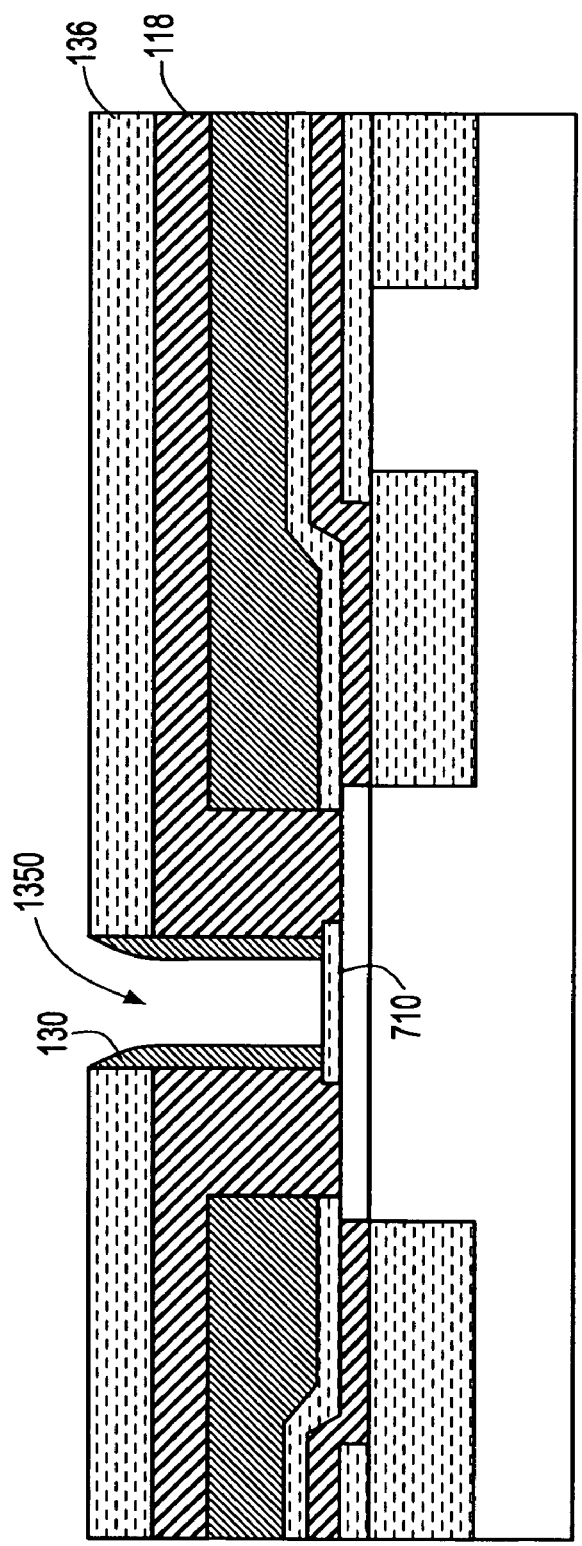

Thereafter, as illustrated in FIG. 14, the exposed portion of polysilicon layer 118 within opening 1150 is vertically etched, as by RIE, stopping on the oxide layer 710, to define a fourth opening 1350. During such etch, the overlying thermal oxide layer 136 is used as a hard mask. A relatively thin spacer 130, preferably consisting essentially of silicon nitride, is formed on a sidewall of the fourth opening 1350, as depicted in FIG. 14. Alternatively, the spacer 130 consists essentially of another nitride such as silicon oxynitride, other suitable nitride, or other dielectric material. Such spacer is preferably formed by a conventional spacer fabrication technique of depositing a conformal layer of the spacer material and thereafter vertically etching the layer, as by RIE.

Figure 15:
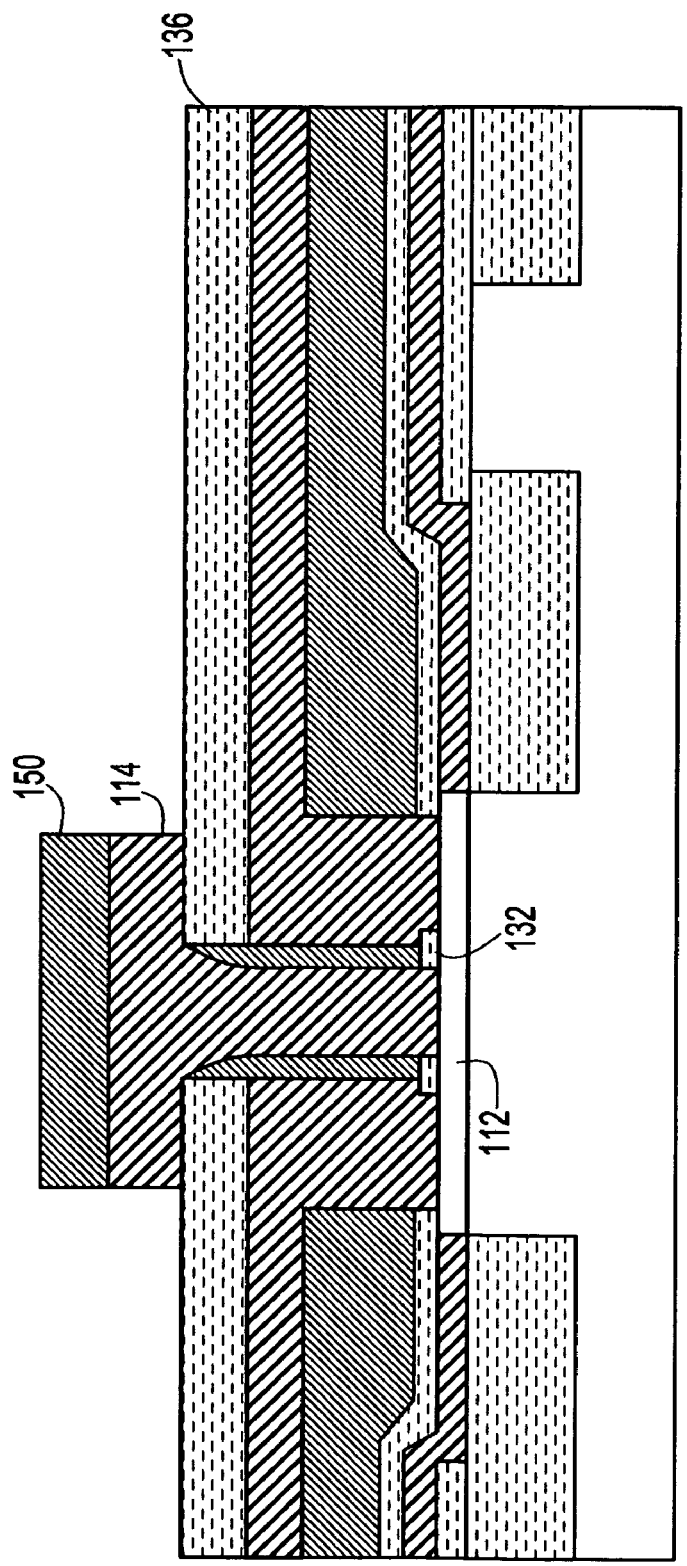

Thereafter, as illustrated in FIG. 15, a series of steps are performed to form the emitter 114 of the HBT 100. In these steps, the oxide layer 710 that is exposed in the opening 1350, where not covered by the nitride spacer 130, is wet stripped by an etch process selective to the exposed material (silicon and/or silicon germanium) of the intrinsic base layer 112, and selective to nitride, to leave oxide spacer 132 in place. Doped polysilicon is then deposited to contact the intrinsic base layer 112 and fill the opening 1350 to form the emitter 114. A dielectric layer 150, preferably including a nitride such as silicon nitride, is deposited on the emitter polysilicon layer 114 to serve as a hardmask in a subsequent step.

Thereafter, a photoresist (not shown) is patterned to expose the dielectric layer 150 in areas except where it overlies the filled opening of the emitter 114. Next, the dielectric layer 150 is RIE etched according to the photoresist pattern. The photoresist is then stripped, and the emitter polysilicon 114 is then patterned, as by RIE, selective to the silicon nitride material of the hardmask layer 150 to expose the oxide layer 136.

Figure 16:
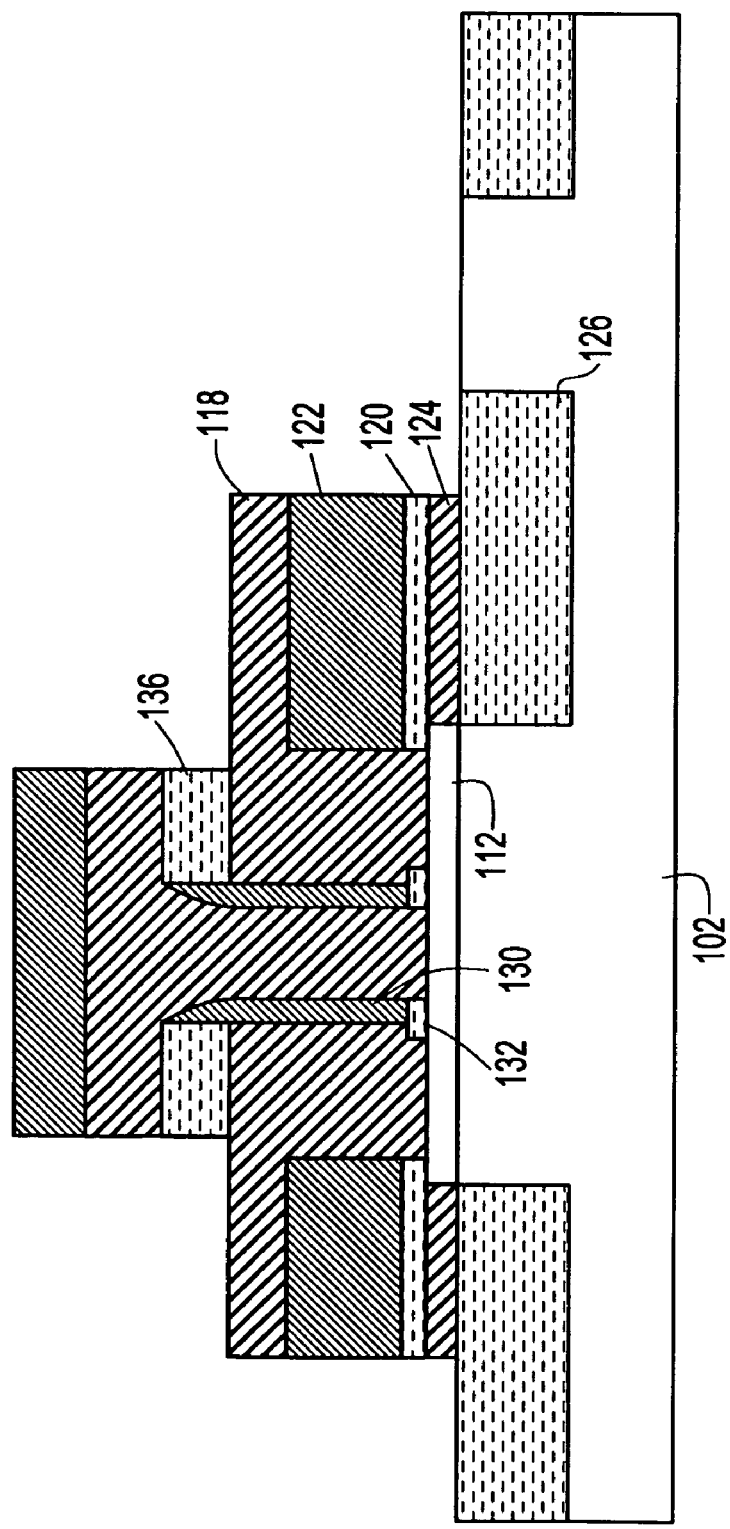

Thereafter, as illustrated in FIG. 16, a photoresist pattern (not shown) is used to vertically etch the stack including oxide layer 136, polysilicon layer 118, silicon nitride layer 122, the oxide layer 120 and the polysilicon layer 124, as by RIE, to expose the shallow trench isolations 126, and to expose the top surface of the polysilicon layer 118 of the raised extrinsic base. Thereafter, as shown in FIG. 17, nitride spacers 158 are formed on exposed sidewalls of the emitter 114 and the stack of layers 118, 120, 122, and 124.

Figure 17:
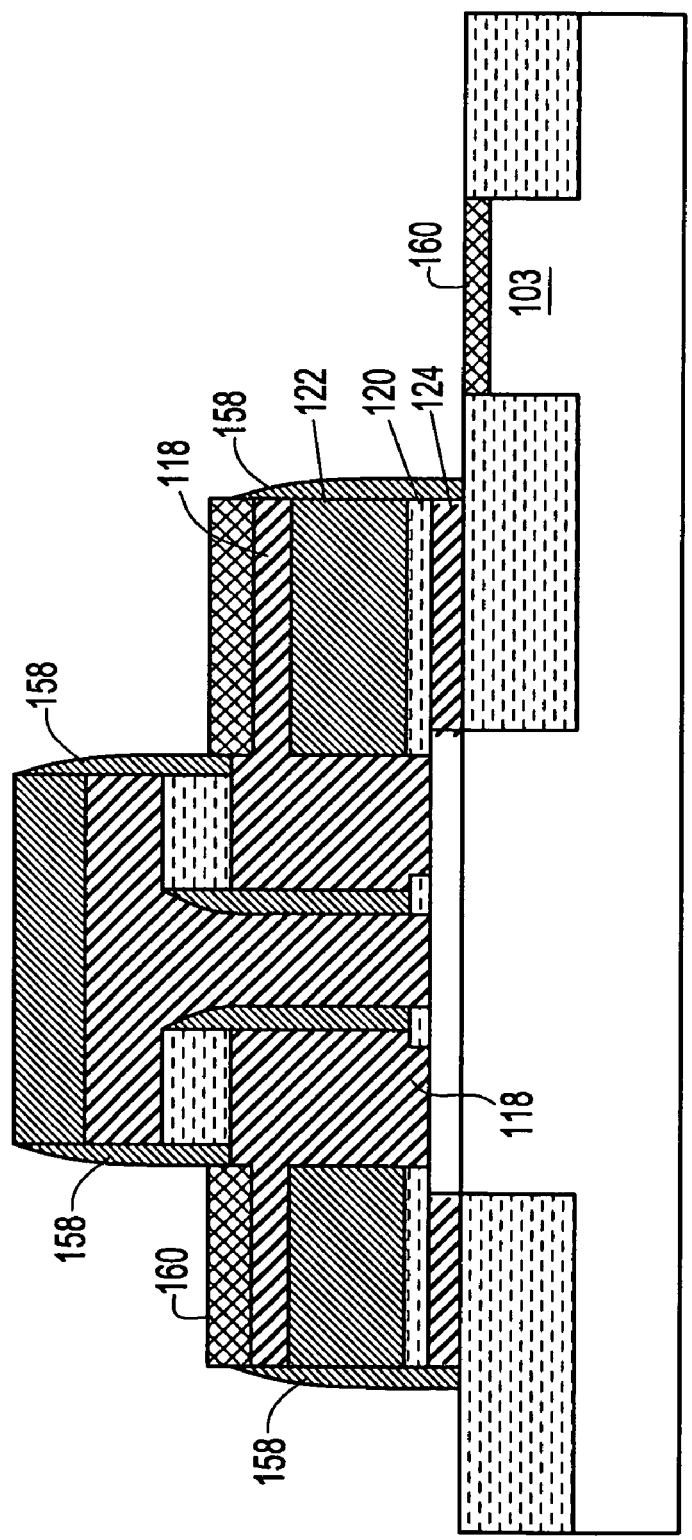

In addition, as illustrated in FIG. 17, a silicide layer 160 is now desirably formed on exposed upwardly facing surfaces of polysilicon layer 118 and the single-crystal silicon collector reach through area 103. Such silicide 160 is formed by depositing a metal that reacts with silicon under appropriate conditions, and thereafter applying conditions, e.g., moderately high temperature, to form the silicide. Unreacted metal is then removed selective to the silicide, leaving the suicide layer 160 in place.

Figure 18:
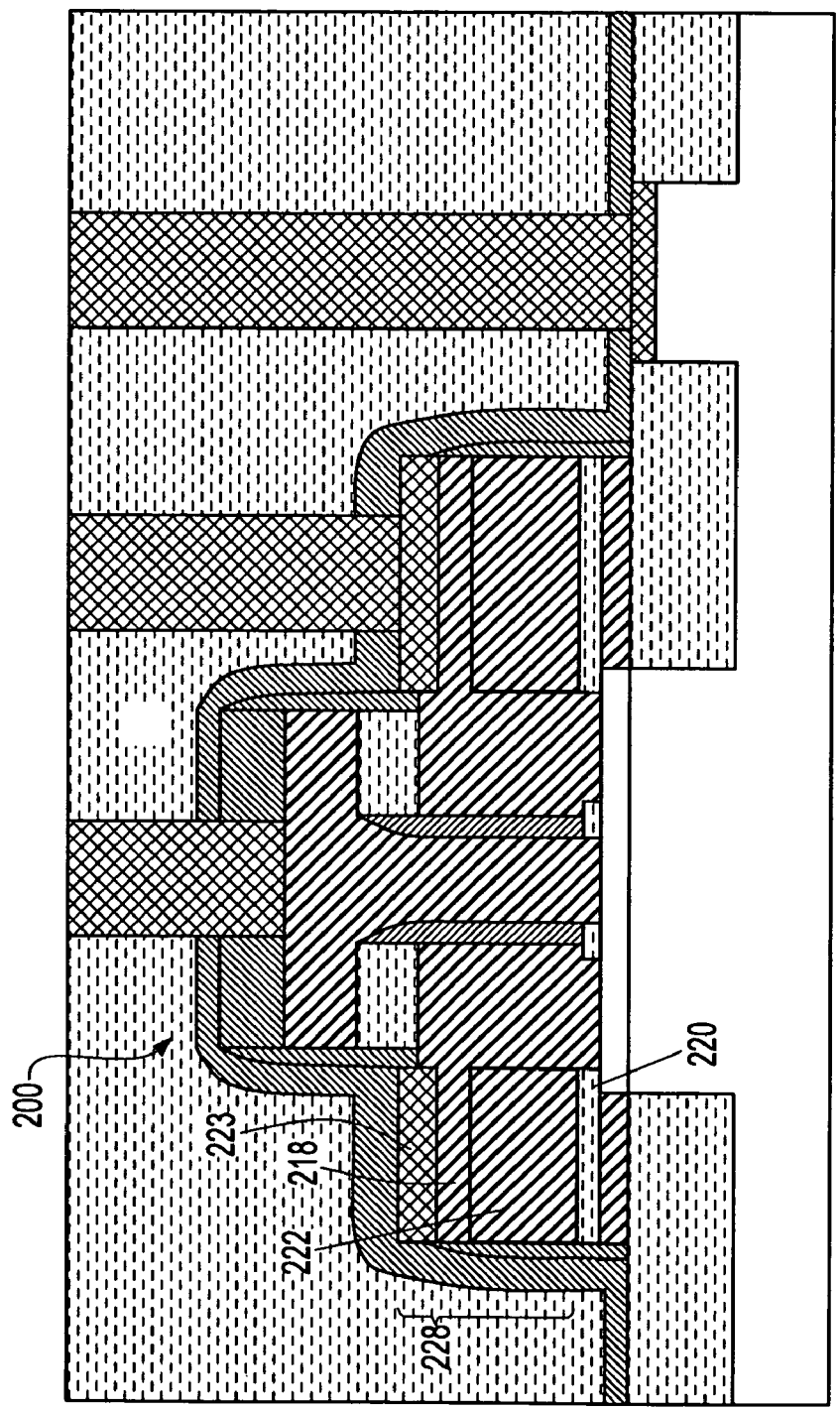
FIG. 18 illustrates a bipolar transistor according to a second preferred embodiment of the invention.

FIG. 18 illustrates an HBT 200 according to another embodiment of the invention. HBT 200 has a structure similar to the HBT 100 shown and described above with respect to FIG. 3. However, in this embodiment, a layer of doped or un-doped polysilicon 222 underlying the polysilicon layer 218 and silicide layer 223 of the raised extrinsic base 228 now is in place of the silicon nitride layer 122 (FIG. 3), as in the above-described embodiment. The process of fabricating HBT 200 differs from that of HBT 100 (FIG. 3) in that a layer 222 of semiconducting material, e.g. polysilicon or polycrystalline silicon germanium, is deposited over the oxide layer 220 instead of depositing silicon nitride at the stage of processing shown and described above with reference to FIG. 5. The polysilicon layer 222 can further reduce the extrinsic base resistance as compared to nitride layer 122.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A bipolar transistor, comprising:
   a collector region;
   an intrinsic base layer overlying said collector region;
   an emitter overlying said intrinsic base layer;
   an opened etch stop layer including a layer of dielectric material overlying said intrinsic base layer, said opened etch stop layer self-aligned to said emitter; and
   a raised extrinsic base overlying said intrinsic base layer, said raised extrinsic base self-aligned to said emitter.

2. A bipolar transistor according to claim 1 wherein said emitter is disposed in an opening having a sublithographic dimension.

3. A bipolar transistor according to claim 1 wherein said emitter is disposed in contact with said intrinsic base layer, and said raised extrinsic base is spaced from said emitter by said opened etch stop layer where said emitter contacts said intrinsic base layer.

4. A bipolar transistor according to claim 3 wherein said opened etch stop layer consists essentially of at least one of an oxide and a nitride.

5. A bipolar transistor according to claim 4 further comprising a dielectric spacer overlying said opened etch stop layer, said dielectric spacer disposed between said raised extrinsic base and said emitter.

6. A bipolar transistor according to claim 5 wherein said opened etch stop layer consists essentially of an oxide and said dielectric spacer consists essentially of a nitride.

7. A heterojunction bipolar transistor (HBT) according to claim 1 wherein said intrinsic base layer includes a layer consisting essentially of a semiconductor alloy, such that said intrinsic base layer forms a heterojunction with at least said collector region.

8. An HBT according to claim 7 wherein said semiconductor alloy includes silicon germanium.

9. A bipolar transistor according to claim 1 wherein said raised extrinsic base includes a layer of semiconductor material and a low resistance layer disposed above said semiconductive layer, said low resistance layer including at least one material selected from metals and metal silicides.

10. A bipolar transistor according to claim 9 wherein said low resistance layer includes said metal silicide.

11. A bipolar transistor according to claim 1, wherein said raised extrinsic base is disposed in conductive contact with said intrinsic base layer from within an opening in a dielectric layer.

12. A bipolar transistor according to claim 1, wherein a dimension of said opening is defined by photolithography.

13. A bipolar transistor according to claim 1 wherein a portion of said raised extrinsic base contacting said intrinsic base layer is disposed within an opening defined by photolithography within a layer consisting essentially of one or more materials selected from conductors and semiconductors.

14. A method of making a bipolar transistor (HBT), comprising:
  forming a collector region;
  forming an intrinsic base layer overlying said collector region;
  forming a first layer of material overlying said intrinsic base layer;
  defining a first opening in said first layer;
  forming an etch stop layer overlying said intrinsic base layer within said first opening, said etch stop layer having edges self-aligned to said first opening;
  conformally depositing a raised extrinsic base material over said first material and inside said first opening to define a second opening wholly overlying said etch stop layer;
  downwardly extending said second opening to said etch stop layer;
  opening said etch stop layer;
  forming an emitter within said second opening; and
  forming a raised extrinsic base from said deposited raised extrinsic base material, said raised extrinsic base self-aligned to said emitter.

15. A method of making a heterojunction bipolar transistor (HBT) according to claim 14 wherein said intrinsic base layer is formed by a step including epitaxially growing a layer consisting essentially of a semiconductor alloy, such that said intrinsic base layer forms a heterojunction with at least said collector region.

16. A method as claimed in claim 14 wherein said second opening is extended downwardly by forming a dielectric spacer on a sidewall of said second opening and etching said etch stop layer from a bottom of said second opening.

17. A method as claimed in claim 14 wherein said step of forming said raised extrinsic base includes forming a low resistance layer contacting said deposited raised extrinsic base material, said low resistance layer including at least one material selected from metals and metal silicides.

18. A method as claimed in claim 17 wherein said low resistance layer includes a metal silicide.

19. A method as claimed in claim 14, wherein said first layer of material consists essentially of a dielectric material.

20. A bipolar transistor according to claim 14 wherein said first opening is defined photolithographically, and said first layer consists essentially of one or more materials selected from conductors and semiconductors.

* * * * *